United States Patent
Lu (10) Patent No.: US 8,843,810 B2
(45) Date of Patent: Sep. 23, 2014

(54) METHOD AND APPARATUS FOR PERFORMING A CRC CHECK

(75) Inventor: Peng Lu, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 99 days.

(21) Appl. No.: 13/586,065

(22) Filed: Aug. 15, 2012

(65) Prior Publication Data

US 2012/0317466 A1     Dec. 13, 2012

(30) Foreign Application Priority Data

Feb. 23, 2010   (CN) .......................... 2010 1 0114360

(51) Int. Cl.
| | |
|---|---|
| *H03M 13/00* | (2006.01) |
| *H03M 13/09* | (2006.01) |
| *H03M 13/15* | (2006.01) |
| *H04L 1/00* | (2006.01) |

(52) U.S. Cl.
CPC ............ *H03M 13/09* (2013.01); *H03M 13/091* (2013.01); *H03M 13/15* (2013.01); *H04L 1/0041* (2013.01); *H04L 1/0061* (2013.01)
USPC .............................. 714/781; 714/758; 714/807

(58) Field of Classification Search
CPC ............................ H03M 13/091; H03M 13/09
USPC .......................................... 714/781, 758, 807
See application file for complete search history.

(56) References Cited

U.S. PATENT DOCUMENTS

| | | | | |
|---|---|---|---|---|
| 5,935,269 A  * | 8/1999 | Kodama et al. | ............... | 714/781 |
| 6,519,738 B1 | 2/2003 | Derby | ........... | 714/781 |
| 7,219,293 B2 * | 5/2007 | Tsai et al. | ..................... | 714/757 |
| 7,831,884 B2 * | 11/2010 | Spencer | ........................ | 714/755 |
| 7,844,886 B1 * | 11/2010 | Ngo | ..................... | 714/785 |
| 7,904,787 B2 * | 3/2011 | Clark et al. | .................... | 714/758 |
| 8,255,761 B1 * | 8/2012 | Pi et al. | .......................... | 714/752 |
| 8,468,439 B2 * | 6/2013 | Kirkpatrick | ................... | 714/807 |
| 8,527,852 B2 * | 9/2013 | Muthu | .......................... | 714/781 |
| 8,543,888 B2 * | 9/2013 | Bommena et al. | ............ | 714/758 |

FOREIGN PATENT DOCUMENTS

| | | | | |
|---|---|---|---|---|
| CN | 1324517 | | 11/2001 | ............ H03M 13/09 |
| CN | 1933605 A | | 3/2007 | ............... H04N 7/64 |
| CN | 101404557 A | | 4/2009 | ................ H04L 1/00 |
| CN | 101795175 A | | 2/2010 | ................ H04L 1/00 |
| EP | 1474873 B1 | | 1/2009 | ............ H03M 13/09 |
| WO | WO2007/012238 A1 | | 1/2007 | ............ H03M 13/09 |

OTHER PUBLICATIONS

Campobello, Giuseppe et al., "Parallel CRC Realization", IEEE Transactions on Computers, vol. 52, No. 10, Oct. 2003, pp. 1312-1319.

* cited by examiner

*Primary Examiner* — Esaw Abraham (57) ABSTRACT

The invention discloses a method and an apparatus for data check processing, the method comprises: acquiring data to be checked; acquiring a first polynomial matrix F according to a generator polynomial; acquiring a second generator polynomial matrix $F_i$ according to $F_i=F^i$, wherein i is the digit of the data; generating a CRC code of the data from the second generator polynomial matrix $F_i$, initial CRC register value $X(0)$ and the data; and sending the data and the CRC code to a receiver for being checked by the receiver.

13 Claims, 7 Drawing Sheets

Replacement Sheet

METHOD AND APPARATUS FOR PERFORMING A CRC CHECK

This is a continuation of International Application PCT/CN2010/076202, with an International Filing Date of Aug. 20, 2010, which claims priority to Chinese Application No. 201010114360.6, filed Feb. 23, 2010, each of which is incorporated by reference.

FIELD OF THE INVENTION

The invention relates to the field of data transmission in communication systems, in particular to a method and an apparatus for data check processing.

BACKGROUND OF THE INVENTION

In the transmission and storage process of data, the received data may be inconsistent with the sent data due to external interference and other reasons. In order to ensure the correctness of data transmission, generally, some encoding and checking methods are applied in the data transmission process. The realizing methods of checking comprise: parity check, cyclic redundancy check (CRC) and so on, wherein the CRC is widely applied in the communication field and other fields due to its high efficiency and performance.

A CRC code is a shortened cyclic code derived from a cyclic code. When applying the CRC, a sender and a receiver perform operation using a same generator polynomial g(x); in addition, the generator polynomial is set by a user and the first coefficient and last coefficient of the g(x) must be 1. The method for processing the CRC mainly comprises: a sender makes the binary data to be sent t(x) be divided by the generator polynomial g(x), and takes the resultant remainder as the CRC code; and when performing the check, it is judged whether a data frame is changed based on whether the calculated check result is 0.

The implementation of the CRC specifically comprises the following steps. Step 1. the data block to be sent is set as a binary polynomial t(x) of m digits and the generator polynomial is set as g(x) of r orders. Plural 0s in the number of r (r zeros) are added to the data block to be sent at its end to make the length of the data block increase to m+r digits, and its corresponding binary polynomial is $x^r t(x)$. Step 2. the data to be sent $x^r t(x)$ is divided by the generator polynomial g(x), and the resultant remainder is a binary polynomial y(x) of r−1 orders. This binary polynomial y(x) is the CRC code of the t(x) encoded by using the generator polynomial g(x). Step 3. Subtracting y(x) from $x^r t(x)$ by module 2 to obtain a binary polynomial $x^r t'(x)$, wherein $x^r t'(x)$ is the character string to be sent comprising the CRC code.

It can be seen according to above mentioned encoding rule of the CRC that the encoding of the CRC is actually to transform the binary polynomial t(x) of m digits to be sent into the binary polynomial $x^r t'(x)$ of m+r digits which can be divided by g(x) without remainder, therefore during decoding, the received data is divided by g(x), and if the remainder herein is zero, it is indicated that the data does not have errors in the transmission process; and if the remainder is not zero, it is indicated that there must be an error in the transmission process.

CRC algorithm can be classified into two types: serial processing and parallel processing, which are explained hereinafter in detail.

Figure 1:
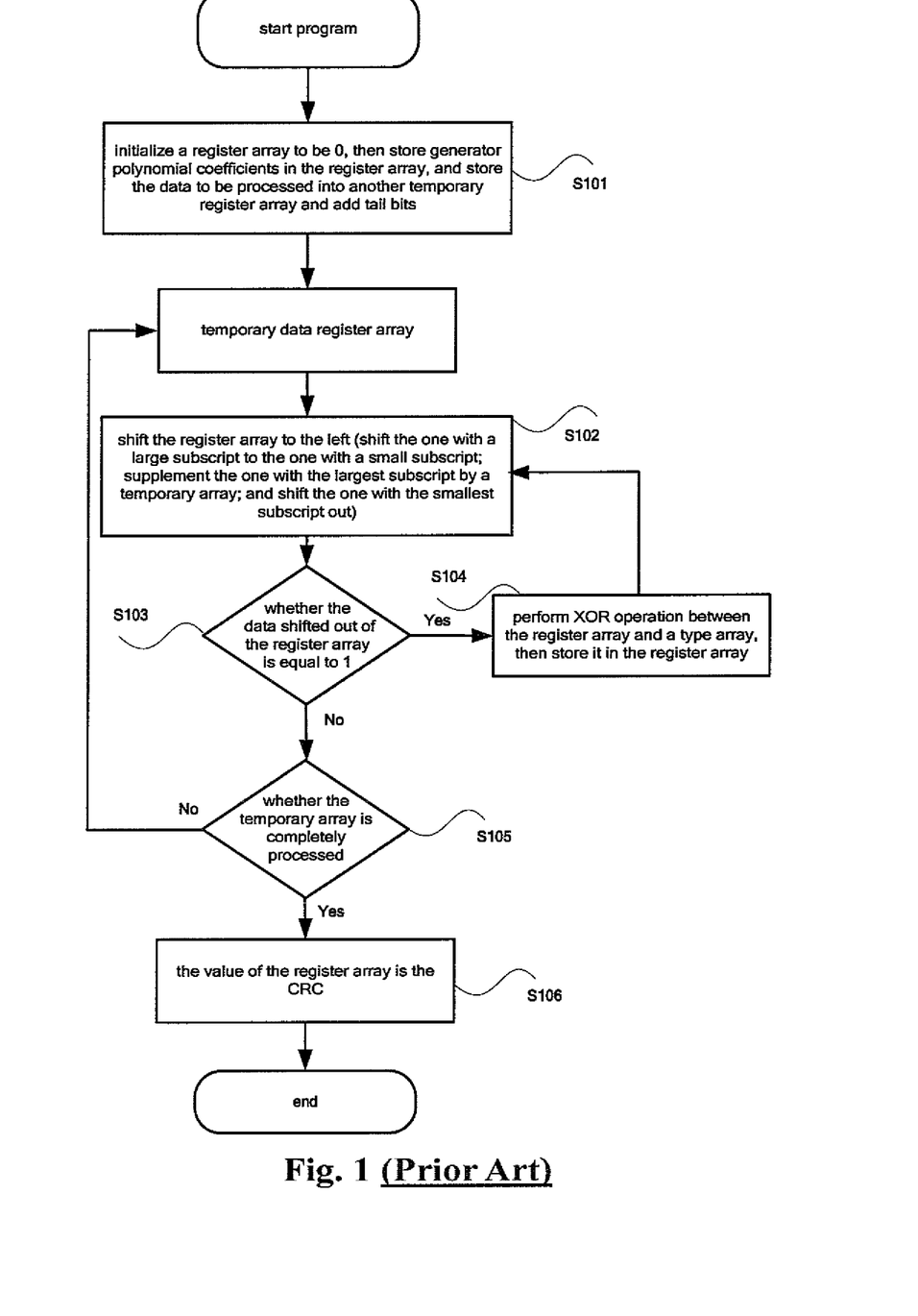
FIG. 1 is a flowchart of a serial processing method for a CRC code according to the related art.

FIG. 1 is a flowchart of a serial processing method for a CRC code according to the related art. As shown in FIG. 1, the method for realizing the CRC code by a serial operation method is described by taking the generator polynomial with the highest degree of 4 (i.e., CRC-4) as an example. Here, four registers are needed to implement division operation, and the method comprises the following steps:

S101: Initializing registers to be 0, then storing generator polynomial coefficients in a register array; at the same time, storing the data to be processed into another temporary register array and adding tail bits to the data to be processed, wherein the method for adding tail bits is implemented by adding four 0s to the information bit stream.

S102: Shifting the register array to the left by 1 bit (shifting the one with a large subscript to the one with a small subscript; supplementing the one with the largest subscript by a temporary array; and shifting the one with the smallest subscript out), and reading in the next bit from the information bit stream of the temporary array and writing it in the $0^{th}$ register.

S103: Judging whether the bit shifted out of the register array is 1, if so, entering S104, otherwise, entering S105.

S104: After the register array undergoing the XOR operation with respect to the generator polynomial, storing it in the register array and returning to S102.

S105: Judging whether the temporary array is completely processed, i.e., judging whether the information bit stream is completely processed, if not, returning to the temporary data register, otherwise, entering S106.

S106: The value of the register array is the CRC, and the calculation ends.

Figure 2:
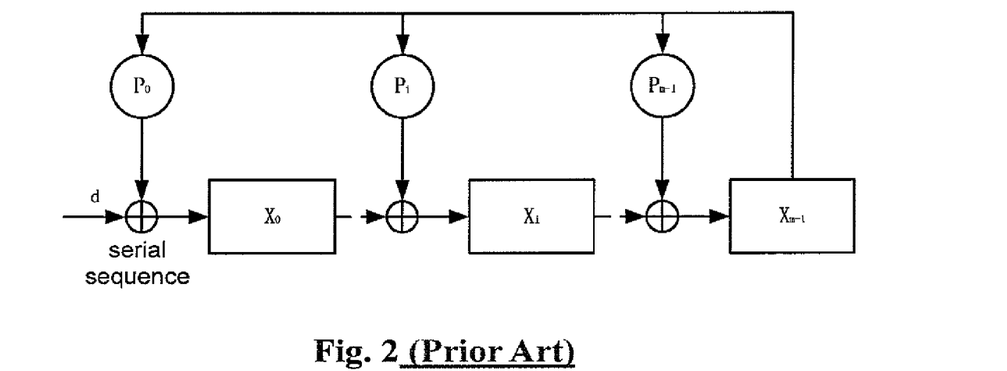
FIG. 2 is a schematic diagram of the structure of type LFSR1 according to the related art.
Figure 3:
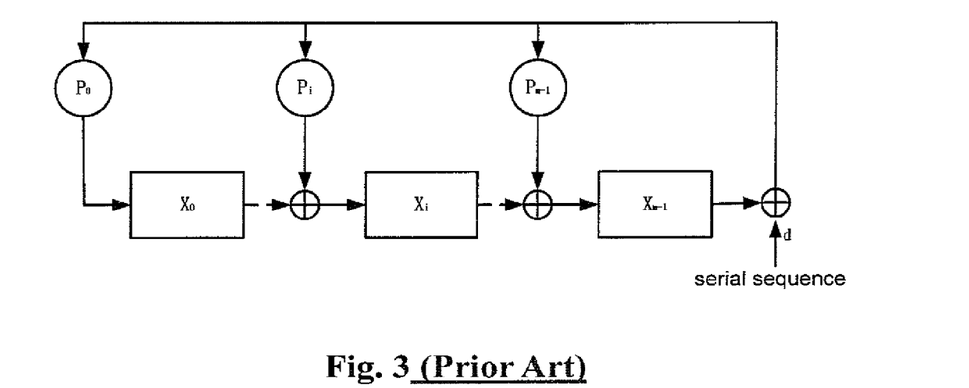
FIG. 3 is a schematic diagram of the structure of type LFSR2 according to the related art.

The serial CRC calculation is generally implemented by the structure of line feedback shift registers (LFSRs). The LFSRs have two structures, respectively called type LFSR1 and type LFSR2. FIG. 2 is a schematic diagram of the structure of type LFSR1 according to the related art; and FIG. 3 is a schematic diagram of the structure of type LFSR2 according to the related art.

It can be known from the above description that in the serial processing method, the processing is made with a bit as the unit, so the efficiency is rather low and the calculation load is high; while the parallel processing method can process 4 bits, 8 bits, 16 bits etc. simultaneously, so as to overcome the above defect of the serial processing method.

Figure 4:
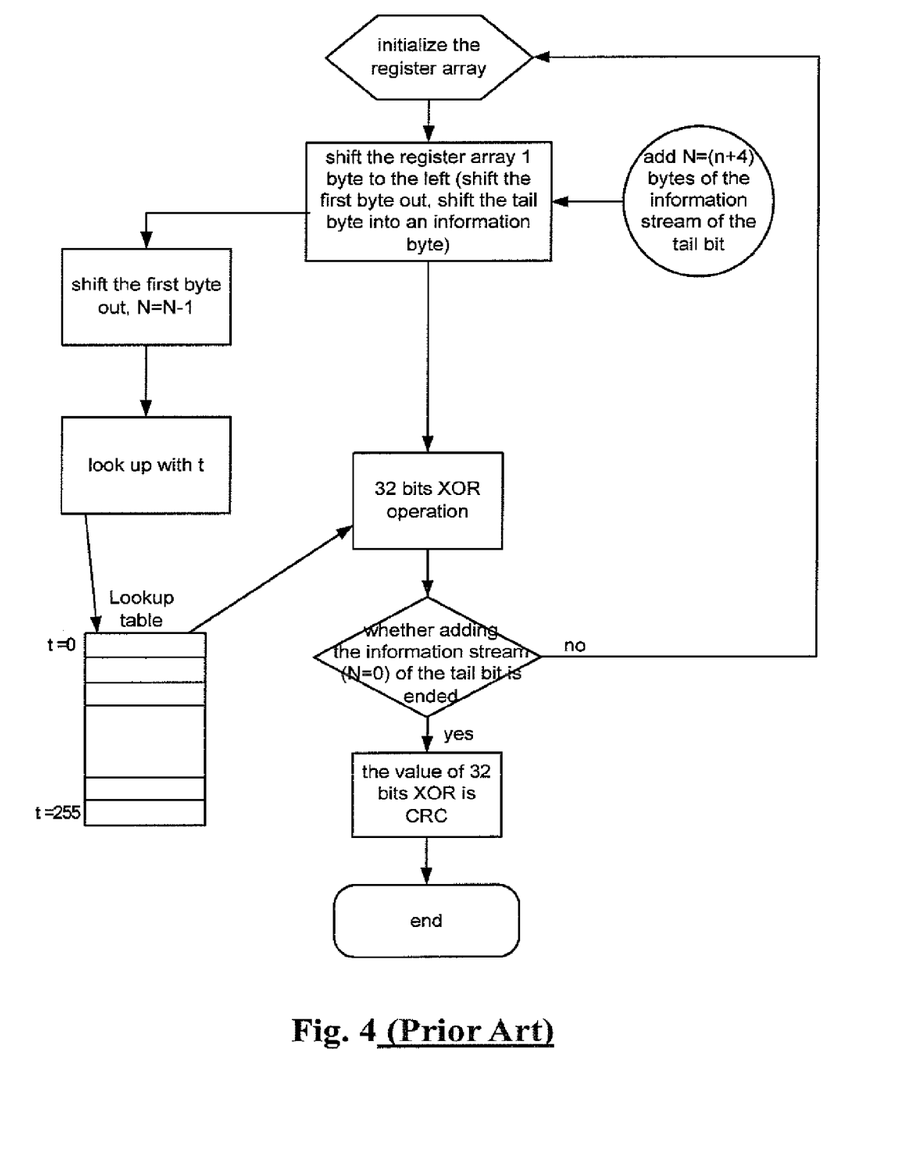
FIG. 4 is a flowchart of a method for processing a CRC code in parallel according to the related art.

The parallel processing method is described hereinafter taking the method for processing the CRC calculation of 8 bits data in parallel using a CRC-32 generator polynomial as an example. FIG. 4 is a flowchart of a method for processing a CRC code in parallel according to the related art. As shown in FIG. 4, a register of 4 bytes (reg) is constructed, with an initial value of 0X00000000; the data to be sent is sequentially shifted to reg 0 (the 0 byte of the register, similar for the following), and at the same time, the data of reg3 is shifted out of reg. The shifted data byte determines what data the reg will undergo XOR with. Since the data to be sent has 8 bits, so that there are 256 selections for the XOR, and the 256 selections form a table corresponding to the data of 8 digits, which is called a lookup table.

At present, the number of digits of the CRC code to be calculated in parallel can only be the nth power of 2; however, in different application scenarios, the number of digits of the data needing to be checked may not be the nth power of 2, but may be odd; under such circumstance, it is needed to add 0 to the front of the data until the number of digits of the data meets the condition of the nth power of 2 to implement the calculation of CRC code in parallel, which has increased the load of registers.

SUMMARY OF THE INVENTION

The present invention provides a solution for data check processing to at least solve the problem that the load of registers is increased when the number of digits of the data needing to be checked is not the nth power of 2 in the related art.

According to one aspect of the present invention, a method for data check processing is provided.

The method for data check processing comprises: acquiring data to be checked; acquiring a first polynomial matrix F according to a generator polynomial; acquiring a second generator polynomial matrix $F_i$ according to $F_i=F^i$, wherein i is the number of digits of the data; generating a CRC code of the data from the second generator polynomial matrix $F_i$, initial CRC register value $X(0)$ and the data; and sending the data and the CRC code to a receiver for being checked by the receiver.

Preferably, generating a CRC code of the data from the second generator polynomial matrix $F_i$, initial CRC register value $X(0)$ and the data comprises: under the condition that the order of the generator polynomial is m with m being greater than or equal to i and the LFSR used for calculation is LFSR1, generating the CRC code $X(i)=F_i \otimes X(0) \oplus D$ of the data, wherein $D=[0, 0, \ldots, 0, d_0, d_1, \ldots, d_{i-2}, d_{i-1}]^T$, $[d_0, d_1, \ldots, d_{i-2}, d_{i-1}]^T$ is the data and the row number of D is m.

Preferably, generating a CRC code of the data from the second generator polynomial matrix $F_i$, initial CRC register value $X(0)$ and the data comprises: under the condition that the order of the generator polynomial is m with m being greater than or equal to i and the LFSR used for calculation is LFSR2, generating the CRC code $X(i)=F_i \otimes (X(0) \oplus D)$ of the data, wherein $D=[d_0, d_1, \ldots, d_{i-2}, d_{i-1}, 0, 0, \ldots, 0]^T$, $[d_0, d_1, \ldots, d_{i-2}, d_{i-1}]^T$ is the data and the row number of D is m.

Preferably, generating a CRC code of the data from the second generator polynomial matrix $F_i$, initial CRC register value $X(0)$ and the data comprises: under the condition that the order of the generator polynomial is m with m being less than i and the LFSR used for calculation is LFSR1, generating the CRC code $X(i)=F_i \otimes X(0) \oplus L_{m*i} \otimes D$ of the data, wherein, D is the data $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \leq k \leq m-i-1$, $P=[P_{m-1}, P_{m-2}, \ldots, P_1, P_0]$ is the generator polynomial, and $I_m$ is a unit matrix.

Preferably, generating a CRC code of the data from the second generator polynomial matrix $F_i$, initial CRC register value $X(0)$ and the data comprises: under the condition that the order of the generator polynomial is m with m being less than i and the LFSR used for calculation is LFSR2, generating the CRC code $X(i)=F_i \otimes (X(0) \oplus L_{m*i} \otimes D)$ of the data, wherein, D is the data $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \leq k \leq m-i-1$, $P=[P_{m-1}, P_{m-2}, \ldots, P_1, P_0]$ is the generator polynomial, and $I_m$ is a unit matrix.

Preferably, before sending the data and the CRC code to a receiver, the method further comprises: selecting from the matrix $X(i)$ one of the columns which each comprise the most term "1", as a first column to be processed; selecting from the matrix $X(i)$ one column which comprises the most "1" with the term "1" being at the same row with any term "1" of the first column to be processed, as the second column to be processed; changing the terms in the row having "1" at all in the first and second columns to be processed, to be "0"; and repeating the above steps until each row only has one term "1" at the most in the matrix $X(i)$.

Preferably, after changing the terms in the row having "1" at all in the first and second columns to be processed to be "0", deleting the columns without "1" in the first and second columns to be processed.

According to another aspect of the present invention, an apparatus for data check processing is provided.

The apparatus for data check processing comprises: an acquiring module, which is configured to acquire data to be checked; a first acquiring module, which is configured to acquire a first polynomial matrix F according to a generator polynomial; a second acquiring module, which is configured to acquire a second generator polynomial matrix $F_i$ according to $F_i=F^i$, wherein i is the number of digits of the data; a generating module, which is configured to generate a CRC code of the data from the second generator polynomial matrix $F_i$, initial CRC register value $X(0)$ and the data; and a sending module, which is configured to send the data and the CRC code to a receiver for being checked by the receiver.

Preferably, the generating module comprises: a first generating sub-module, which is configured to generate the CRC code $X(i)=F_i \otimes X(0) \oplus L_{m*i} \otimes D$ of the data, under the condition that the order of the generator polynomial is m with m being less than i, and the LFSR used for calculation is LFSR1, wherein, D is the data $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \leq k \leq m-i-1$, $P=[P_{m-1}, P_{m-2}, \ldots, P_1, P_0]$ is the generator polynomial, and $I_m$ is a unit matrix.

Preferably, the generating module comprises: a second generating sub-module, which is configured to generate the CRC code $X(i)=F_i \otimes (X(0) \oplus L_{m*i} \otimes D)$ of the data, under the condition that the order of the generator polynomial is m with m being less than i, and the LFSR used for calculation is LFSR2, wherein, D is the data $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \leq k \leq m-i-1$, $P=[P_{m-1}, P_{m-2}, \ldots, P_1, P_0]$ is the generator polynomial, and $I_m$ is a unit matrix.

By virtue of the present invention, a solution is applied including: acquiring a generator polynomial matrix according to a generator polynomial and the number of digits of the data to be checked and generating a CRC code using a formula for calculating the CRC code of the data acquired according to the generator polynomial matrix, initial CRC register value and the data to be checked, and as a result, the problem that the load of registers is increased when the number of digits of the data needing to be checked is not the nth power of 2 in the conventional art is solved, and the effect of reducing the load of registers is achieved.

BRIEF DESCRIPTION OF THE DRAWINGS

The drawings illustrated here provide a further understanding of the present invention and form a part of the present application. The exemplary embodiments and the description thereof are used to explain the present invention without unduly limiting the scope of the present invention. In the drawings.

DETAILED DESCRIPTION OF EMBODIMENTS

The present invention will be described in detail with reference to the drawings and in conjunction with the embodiments hereinafter. It should be noted that the embodiments of the present invention and features in the embodiments can be combined with each other if there is in no conflict.

According to one aspect of the present invention, an apparatus for data check processing is provided.

Figure 5:
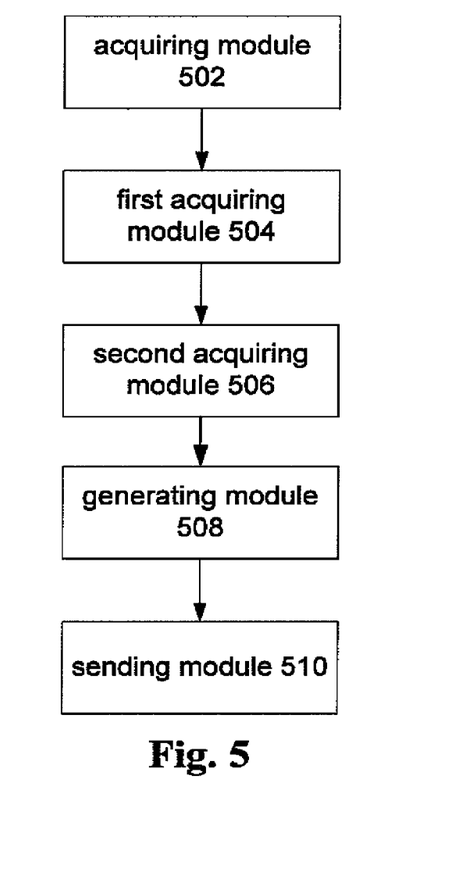
FIG. 5 is a block diagram of the structure of an apparatus for data check processing according to an embodiment of the present invention.

FIG. 5 is a block diagram of the structure of an apparatus for data check processing according to an embodiment of the present invention. As shown in FIG. 5, the apparatus comprises: an acquiring module 502, a first acquiring module 504, a second acquiring module 506, a generating module 508, and a sending module 510, which are described in detail hereinafter.

The acquiring module 502 is configured to acquire data needing to be checked; the first acquiring module 504 is connected to the acquiring module 502 and is configured to acquire a first polynomial matrix F according to a generator polynomial; the second acquiring module 506 is connected to the first acquiring module 504 and is configured to acquire a second generator polynomial matrix $F_i$ according to $F_i = F^i$, wherein i is the number of digits of the data; the generating module 508 is connected to the second acquiring module 506 and is configured to generate a CRC code of the data from the second generator polynomial matrix $F_i$, initial CRC register value $X(0)$ and the data; and the sending module 510 is connected to the generating module 508 and is configured to send the data and the CRC code to a receiver for being checked by the receiver.

In this embodiment, the CRC code is generated according to the number of digits of the data to be checked, so the data can be checked without adding 0 to the front of the data for calculation, thus the load of registers is reduced.

Figure 6:
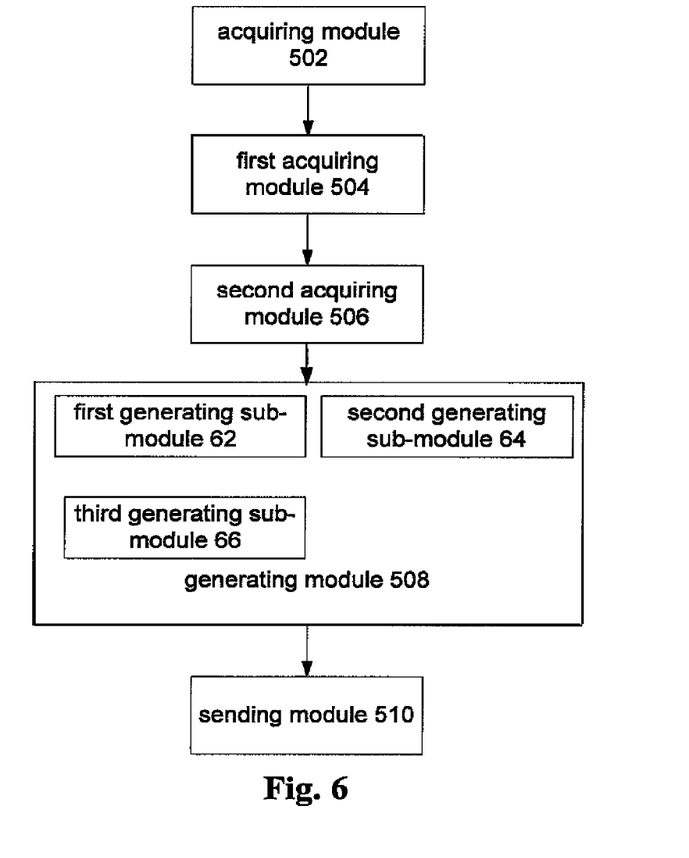
FIG. 6 is a block diagram of the specific structure of an apparatus for data check processing according to an embodiment of the present invention.

FIG. 6 is a block diagram of the specific structure of an apparatus for data check processing according to an embodiment of the present invention; and the embodiment of the present invention is described in detail hereinafter in conjunction with FIG. 6.

In a preferred embodiment of the present invention, the generating module 508 comprises: a first generating sub-module 62, which is configured to generate the CRC code $X(i)=F_i \otimes X(0) \oplus L_{m*i} \otimes D$ of the data to be checked, under the condition that the order of the generator polynomial is m with m being less than i, and the LFSR used for calculation is LFSR1, wherein, D is the data $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \le k \le m-i-1$, $P=[P_{m-1}, P_{m-2}, \ldots, P_1, P_0]$ is the generator polynomial, and $I_m$ is a unit matrix.

This embodiment realizes that a CRC code of the data is generated according to the number of digits i of the data under the condition that m is less than i and the LFSR used for calculation is LFSR1, so the data can be checked without adding 0 to the front of the data for calculation, thus the load of registers is reduced.

In another preferred embodiment of the present invention, the generating module 508 further comprises: a second generating sub-module 64, which is configured to generate the CRC code $X(i)=F_i \otimes [X(0) \oplus L_{m*i} \otimes D]$ of the data to be checked, under the condition that the order of the generator polynomial is m with m being less than i, and the LFSR used for calculation is LFSR2, wherein $X(i)$ is the CRC code of the data to be checked, D is the data to be checked $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \le k \le m-i-1$, $P=[P_{m-1}, P_{m-2}, \ldots, P_1, P_0]$ is the generator polynomial, and $I_m$ is a unit matrix.

This embodiment realizes that a CRC code of the data is generated according to the number of digits i of the data under the condition that m is less than i and the LFSR used for calculation is LFSR2, so the data can be checked without adding 0 to the front of the data for calculation, thus the load of registers is reduced.

In another preferred embodiment of the present invention, the generating module 508 further comprises: a third generating sub-module 66, which is configured to generate the CRC code $X(i)=F_i \otimes X(0) \oplus D$ of the data to be checked, under the condition that the order of the generator polynomial is m with m being greater than or equal to i, and the LFSR used for calculation is LFSR1, wherein $D=[0, 0, \ldots, 0, d_0, d_1, \ldots, d_{i-2}, d_{i-1}]^T$, the data to be checked is $[d_0, d_1, \ldots, d_{i-2}, d_{i-1}]^T$ and the row number of D is m.

This embodiment realizes that a CRC code of the data is generated according to the number of digits i of the data under the condition that m is greater than or equal to i and the LFSR used for calculation is LFSR1, so the data can be checked without adding 0 to the front of the data to make the number of digits of the data reach the nth power of 2 for calculation, thus the load of registers is reduced.

In correspondence to the above apparatus embodiment, the present invention further provides a method for data check processing.

Figure 7:
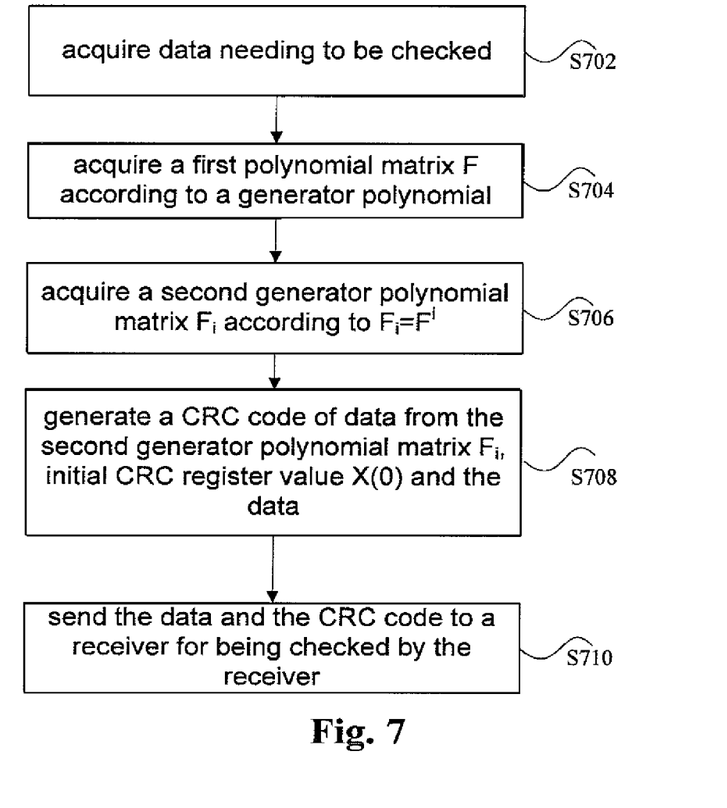
FIG. 7 is a flowchart of a method for data check processing according to an embodiment of the present invention.

FIG. 7 is a flowchart of a method for data check processing according to an embodiment of the present invention. As shown in FIG. 7, the method comprises the following steps:

S702: acquiring data needing to be checked;

S704: acquiring a first polynomial matrix F according to a generator polynomial;

S706: acquiring a second generator polynomial matrix $F_i$ according to $F_i=F^i$, wherein i is the number of digits of the data;

S708: generating a CRC code of data from the second generator polynomial matrix $F_i$, initial CRC register value $X(0)$ and the data; and S710: sending the data and the CRC code to a receiver for being checked by the receiver.

In this embodiment, the CRC code is generated using the number of digits of the data to be choked, so the data can be checked without adding 0 to the front of the data for calculation, thus the load of registers is reduced.

In a preferred embodiment of the invention, under the condition that the order of the generator polynomial is m with m being greater than or equal to i and the LFSR used for calculation is LFSR1, the CRC code $X(i)=F_i \otimes X(0) \oplus D$ of the data to be checked is generated, wherein, $D=[0, 0, \ldots, 0, d_0, d_1, \ldots, d_{i-2}, d_{i-1}]^T$ and the data to be checked is $[d_0, d_1, \ldots, d_{i-2}, d_{i-1}]^T$.

This embodiment realizes that a CRC code of the data is generated according to the number of digits i of the data under the condition that m is greater than or equal to i and the LFSR used for calculation is LFSR1, so the data can be checked without adding 0 to the front of the data to make the number of digits of the data reach the nth power of 2 for calculation, thus the load of registers is reduced.

In another preferred embodiment of the invention, under the condition that the order of the generator polynomial is m with m being greater than or equal to i and the LFSR used for calculation is LFSR2, the CRC code $X(i)=F_i \otimes [X(0) \oplus D]$ of the data to be checked is generated, wherein, $D=[d_0, d_1, \ldots, d_{i-2}, d_{i-1}, 0, 0, \ldots, 0]^T$ and the data to be checked is $[d_0, d_1, \ldots, d_{i-2}, d_{i-1}]^T$.

This embodiment realizes that a CRC code of the data is generated according to the number of digits i of the data under the condition that m is greater than or equal to i and the LFSR used for calculation is LFSR2, so the data can be checked without adding 0 to the front of the data for calculation, thus the load of registers is reduced.

In another preferred embodiment of the invention, under the condition that the order of the generator polynomial is m with m being less than i and the LFSR used for calculation is LFSR1, the CRC code $X(i)=F_i \otimes X(0) \oplus L_{m*i} \otimes D$ of the data to be checked is generated, wherein, D is the data to be checked $[d_0, d_1, \ldots, d_{i-2}, d_{i-1}]^T$, and $L_{m*i}=[F_{m-i-1} \otimes P, F_{m-i-2} \otimes P, \ldots, P|I_m]_{m*i}$; $F_k$ is the k-th power of F, $0 \leq k \leq m-i-1$, $P=[P_{m-1}, P_{m-2}, \ldots, P_1, P_0]$ is the generator polynomial, and $I_m$ is a unit matrix.

This embodiment realizes that a CRC code of the data is generated according to the number of digit i of the data under the condition that m is less than i and the LFSR used for calculation is LFSR1, so the data can be checked without adding 0 to the front of the data for calculation, thus the load of registers is reduced.

In another preferred embodiment of the invention, under the condition that the order of the generator polynomial is m with m being less than i and the LFSR used for calculation is LFSR2, the CRC code $X(i)=F_i \otimes [X(0) \oplus L_{m*i} \otimes D]$ of the data to be checked is generated, wherein, D is the data to be checked $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$; $F_k$ is the k-th power of F, $0 \leq k \leq m-i-1$, $P=[P_{m-1}, P_{m-2}, \ldots, P_1, P_0]$ is the generator polynomial, and $I_m$ is a unit matrix.

This embodiment realizes that a CRC code of the data is generated according to the number of digits i of the data under the condition that m is less than i and the LFSR used for calculation is LFSR2, so the data can be checked without adding D to the front of the data for calculation, thus the load of registers is reduced.

In addition, before the data to be checked and the CRC code X(i) are sent to a receiver, the following steps are performed: selecting from the matrix X(i) one of the columns which each comprise the most term "1", as a first column to be processed; selecting from the matrix X(i) one column which comprises the most "1" with the term "1" being at the same row with any term "1" of the first column to be processed, as the second column to be processed; changing the terms in the row having "1" at all in the first and second columns to be processed, to be "0"; and repeating the above steps until each row only has one term "1" at the most in the matrix X(i).

This embodiment simplifies the calculation in the data check process by combining the common terms of the CRC code.

Preferably, after changing the terms in the row having "1" at all in the first and second columns to be processed to be "0", the columns without "1" in the first and second columns to be processed are deleted.

This embodiment further simplifies the calculation and improves the efficiency of generating the CRC code by deleting the columns in which all terms are "0".

The implementation process of the present invention is described in detail hereinafter in conjunction with the drawings and preferred embodiments.

Preferred Example One

Figure 8:
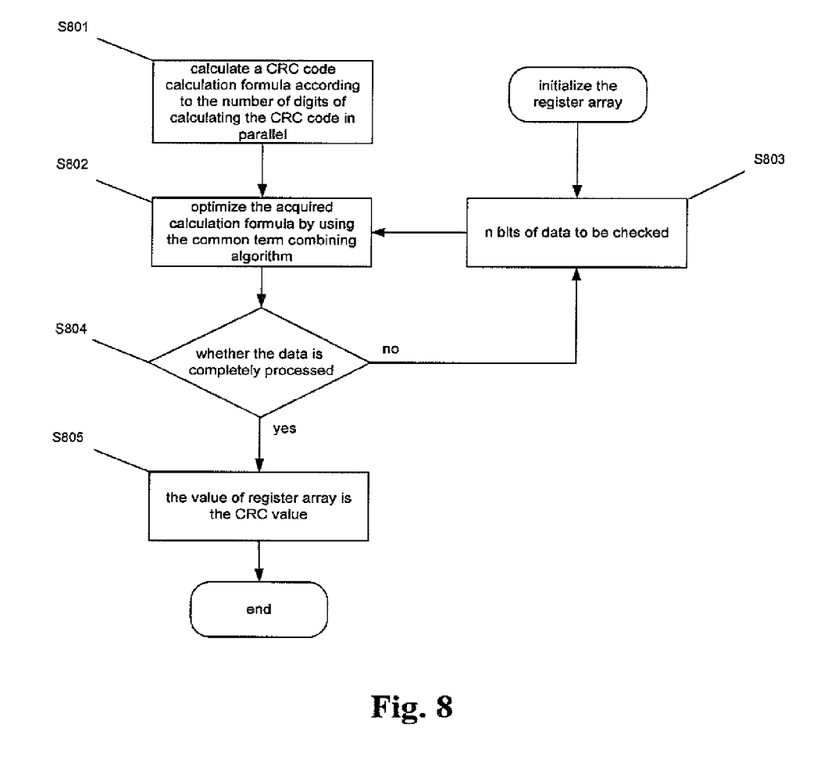
FIG. 8 is a flowchart of a method for data check processing according to the preferred example one of an embodiment of the present invention.

The embodiment of the present invention finally acquires the CRC code by substituting into a XOR matrix calculated according to a formula the data to be calculated and the last calculated CRC code wherein every time the data to be calculated is input in parallel. FIG. 8 is a flowchart of a method for data check processing according to the preferred Example One of the present invention. As shown in FIG. 8, the method comprises:

S801: calculating a CRC code calculation formula according to the number of digits of calculating the CRC code in parallel.

in the example of the LFSR1, the mode of acquiring the CRC code computation formula is described hereinafter. Under the condition that m is greater than or equal to i and the LFSR used for calculation is LFSR1, the CRC code computation formula is acquired. If $X=[x_{m-i}, \ldots, x_1, x_0]^T$ represents the j-th calculated CRC code, $X'=[x'_{m-1}, \ldots, x'_1, x'_0]^T$ represents the j+1 th calculated CRC code, and the generator polynomial is written as $P=\{p_m, p_{m-1}, \ldots, p_0\}$; d represents a code of 1 bit serially calculated; meanwhile, $\oplus$ represents the XOR calculation of the elements at the same location of two matrixes, $\otimes$ represents bit AND calculation; in the present invention, $\otimes$ specifically represents that the elements in each row of a matrix respectively undergo AND calculation with each element in another column matrix, and then XOR calculation is performed with the calculation result to obtain a column matrix; and according to the CRC calculation principle, the following equations can be acquired:

$$\begin{cases} x'_{m-1} = (p_{m-1} \otimes x_{m-1}) \oplus x_{m-2} \\ x'_{m-2} = (p_{m-2} \otimes x_{m-1}) \oplus x_{m-3} \\ \ldots \\ x'_1 = (p_1 \otimes x_{m-1}) \oplus x_0 \\ x'_0 = (p_0 \otimes x_{m-1}) \oplus d. \end{cases}$$

According to the equations, the CRC code calculation formula of i bits of data input in parallel can be acquired:

$$X(i) = [F_i \otimes X(0)] \oplus ([f_{i-1} \otimes G, \ldots, F \otimes G, F]) \otimes \quad (1)$$
$$[d_0, d_1, \ldots, d_{i-2}, d_{i-1}]^T)$$
$$= F_i \otimes X(0) \oplus D.$$

Wherein, $G=[0, 0, \ldots, 0, 1]^T$, vector $D=[0, 0, \ldots, 0, d_0, d_1, \ldots, d_{i-2}, d_{i-1}]^T$, the row number of D is m, $F_i$ is the i-th power of F, $$F = \begin{Bmatrix} p_{m-1} & 1 & 0 & \ldots & 0 \\ p_{m-2} & 0 & 1 & \ldots & 0 \\ \ldots & \ldots & \ldots & \ldots & \ldots \\ p_1 & 0 & 0 & \ldots & 1 \\ p_0 & 0 & 0 & \ldots & 0 \end{Bmatrix}.$$

Similarly, under the condition that m is greater than or equal to i and the LFSR used for calculation is LFSR2, the CRC code calculation formula is:

$$X(i) = F_i \otimes (X(0) \oplus D).$$

Wherein, $D=[d_0, d_1, \ldots, d_{i-2}, d_{i-1}, 0, 0, \ldots, 0]^T$, the row number of D is m, other parameters are the same as the LFSR1.

When m is less than i, the following formula is still valid:

$$X(i)=[F_i \otimes X(0)] \oplus ([F_{i-1} \otimes G, \ldots, F \otimes G, G]) \otimes [d_0, d_1, \ldots, d_{i-2}, d_{i-1}]^T) \quad (2)$$

Let column vector $h_i = F_i \otimes G$, $h_i(j)$ is the j-th element of the vector $h_i$, j is the row number of vector $h_i$, $0 \le j \le m-1$, and m here represents the last m elements in the i elements, it can be known according to the characteristics of the generator polynomial that:

$$h_i(j) = \begin{cases} 1, & j = m - 1 - i \\ 0, & \text{others}. \end{cases}$$

It can be known according to the above formula that the matrix $[F_{i-1} \otimes G, F_{i-2} \otimes G, \ldots, G]$ has the following form:

$$[F_{i-1} \otimes G, F_{i-2} \otimes G, \ldots, G] = \begin{bmatrix} 0_{(m-1)*t} \\ I_i \end{bmatrix}. \quad (3)$$

Wherein $I_i$ is a unit matrix, when i=m, it can be acquired that:

$$[F_{i-1} \otimes G, F_{i-2} \otimes G, \ldots, G] = I_i. \quad (4)$$

And as to the generator polynomial matrix $F_i$, it has the following form:

$$F_i = [F_{i-1} \otimes P, F_{i-2} \otimes P, \ldots, F_{i-m} \otimes P]. \quad (5)$$

Wherein, the generator polynomial $P=[p_{m-1}, p_{m-2}, \ldots, p]$.

Substituting formula (4) and (5) into formula (2), it can be acquired that:

$$X(i) \, [F_i \otimes X(0)] \oplus ([F_{i-m-1} \otimes P, \ldots, F \otimes P, P|I_m])$$
$$\otimes [d_0, d_1, \ldots, d_{i-2}, d_{i-1}]^T) \quad (6)$$

So, it can be acquired that the CRC code calculation formula for the LFSR1 is:

$$X(i) = F_i \otimes X(0) \oplus L_{m*i} \otimes D. \quad (7)$$

Wherein, $L_{m*i}=[F_{m-i-1} \otimes P, F_{m-i-2} \otimes P, \ldots, P|I_m]_{m*i}$, $|I_m$ refers to a supplementing unit matrix $I_m$, which makes $F_{m-i-1} \otimes P, F_{m-i-2} \otimes P, \ldots, P|I_m$ form a m*i matrix. $F_k$ is the k-th power of F, $0 \le k \le m-i-1$, $P=[p_{m-1}, p_{m-2}, \ldots, p_1, p_0]$.

Similarly, the CRC code calculation formula for LFSR2 is:

$$X(i) = F_i \otimes (X(0) \oplus L_{m*i} \otimes D). \quad (8)$$

Wherein, $L_{m*i}=[F_{m-i-1} \otimes P, F_{m-i-2} \otimes P, \ldots, P|I_m]_{m*i}$, $F_k$ is the k-th power of F, $0 \le k \le m-i-1$, $P=[p_{m-1}, p_{m-2}, \ldots, p_1, p_0]$, the priority level of $\otimes$ is higher than that of $\oplus$ in the calculation process.

S802: Optimizing the acquired calculation formula by using the common term combining algorithm.

X(i) is a column matrix and each term of the column matrix is a XOR calculation of multiple parameters, so logic levels can be minimized using the common term combining algorithm. Finding out as many as possible XOR logics which can be shared reduces the calculation time and optimizes the performance.

Figure 9:
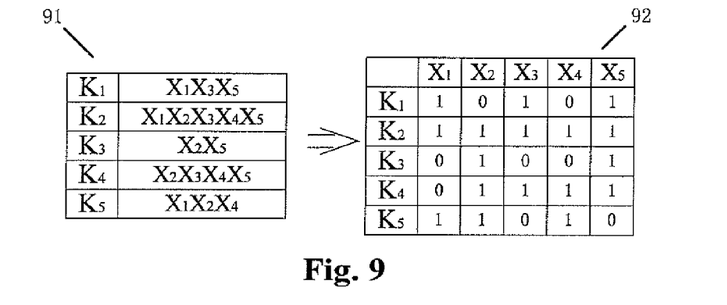
FIG. 9 is a schematic diagram of the combination of common terms according to an embodiment of the present invention.

For example, the corresponding equations of the matrix X(i) are:

$$K(X) \begin{cases} K_1 = X_i \oplus X_3 \oplus X_5 \\ K_2 = X_1 \oplus X_2 \oplus X_3 \oplus X_4 \oplus X_5 \\ K_3 = X_2 \oplus X_5 \\ K_4 = X_2 \oplus X_3 \oplus X_4 \oplus X_5 \\ K_5 = X_1 \oplus X_2 \oplus X_4 \end{cases}$$

FIG. 9 is a schematic diagram of the combination of common terms according to an embodiment of the present invention. As shown in FIG. 9, the equations K(X) are transformed from Table 91 into Table 92. According to Table 92, the main implementation steps of the common term combination algorithm are as follows:

1. Finding out the column which comprise the most "1" in the matrix shown in Table 92, if there are two such columns, selecting the column having the smallest ordinal number, and recording it as a column A (for example, the columns $X_2$ and $X_5$ comprise the same number of "1", selecting $X_2$ whose ordinal number is smaller here); and it should be noted that if there are more than two such columns, selecting the column having the largest ordinal number as the column A.

2. Finding out the column which comprises the most "1" with the term "1" being at the same row with any term "1" of the column A; if there are two such columns, selecting the column which comprises the least "1" and has the smallest column number, and record it as column B (for example, $X_4$ and $X_5$ comprise the same number of "1" in each row as that in $X_2$, selecting $X_4$ whose column number is smaller here); it should be noted that if there are more than two such columns, selecting the column which has the least "1" and the smallest column number is only for the convenience of the calculation, and selecting other columns as the column B is also available.

3. Changing the terms in the rows having "1" at all in the columns A and B to be "0", if the column A or column B does not comprise the term "1", the column can be deleted (for example, changing the same terms in columns $X_2$ and $X_4$ to be "0", if $X_4$ only comprises "0", the column can be deleted).

4. If the number of "1"s in each row is less than or equal to one in the matrix, stopping the optimization, otherwise, repeating the above mentioned three steps.

S803: Substituting the data to be checked into the formula acquired in S802 in parallel.

Substituting the data whose CRC code is to be calculated and the last calculated CRC code into the calculated formula, the calculated CRC code of this time can be acquired.

S804: Judging whether the data to be checked is completely processed, if not, returning to S802 for circular process until the data processing is completed.

S805: After the data is completely processed, the value in the registers is the finally acquired CRC code value of the data needing to be checked. Then, the CRC code and the data together are sent to a receiver for being checked by the receiver.

Preferred Example Two

As an example of a parallel computation of data of 36 bits with CRC-$16=X^{16}+X^{15}+X^2+1$ and the LFSR being LFSR2, the implementation process of the embodiment of the invention is described hereinafter.

The generator polynomial matrix and transformation matrix related to the number of digits of data are acquired by calculation, which are:

$$F_{36} = \begin{pmatrix} 1 & 1 & 1 & 1 & 1 & 1 & 1 & 0 & 0 & 1 & 1 & 1 & 1 & 1 & 1 \\ 0 & 0 & 0 & 0 & 0 & 0 & 1 & 0 & 1 & 0 & 0 & 0 & 0 & 0 & 0 \\ 0 & 0 & 0 & 0 & 0 & 0 & 0 & 1 & 0 & 1 & 0 & 0 & 0 & 0 & 0 \\ 0 & 0 & 0 & 0 & 0 & 0 & 0 & 0 & 1 & 0 & 1 & 0 & 0 & 0 & 0 \\ 0 & 0 & 0 & 0 & 0 & 0 & 0 & 0 & 0 & 1 & 0 & 1 & 0 & 0 & 0 \\ 0 & 0 & 0 & 0 & 0 & 0 & 0 & 0 & 0 & 0 & 1 & 0 & 1 & 0 & 0 \\ 1 & 0 & 0 & 0 & 0 & 0 & 0 & 0 & 0 & 0 & 0 & 1 & 0 & 1 & 0 \\ 1 & 1 & 0 & 0 & 0 & 0 & 0 & 0 & 0 & 0 & 0 & 0 & 1 & 0 & 1 \\ 1 & 1 & 1 & 0 & 0 & 0 & 0 & 0 & 0 & 0 & 0 & 0 & 0 & 1 & 0 \\ 1 & 1 & 1 & 1 & 0 & 0 & 0 & 0 & 0 & 0 & 0 & 0 & 0 & 0 & 1 \\ 0 & 1 & 1 & 1 & 1 & 0 & 0 & 0 & 0 & 0 & 0 & 0 & 0 & 0 & 0 \\ 0 & 0 & 1 & 1 & 1 & 1 & 0 & 0 & 0 & 0 & 0 & 0 & 0 & 0 & 0 \\ 0 & 0 & 0 & 1 & 1 & 1 & 1 & 0 & 0 & 0 & 0 & 0 & 0 & 0 & 0 \\ 0 & 0 & 0 & 0 & 1 & 1 & 1 & 1 & 0 & 0 & 0 & 0 & 0 & 0 & 0 \\ 1 & 1 & 1 & 1 & 1 & 0 & 0 & 1 & 1 & 1 & 1 & 1 & 1 & 1 & 1 \\ 1 & 1 & 1 & 1 & 1 & 0 & 0 & 1 & 1 & 1 & 1 & 1 & 1 & 1 & 1 \end{pmatrix},$$

$$L_{16*36} = \begin{pmatrix} 1 & 1 & 1 & 1 & 1 & 1 & 0 & 1 & 1 & 1 & 1 & 1 & 1 & 1 & 1 & 1 & 1 & 1 & 1 & 0 & \ldots & & \ldots & 0 & 0 \\ 0 & 0 & 0 & 0 & 0 & 0 & 1 & 1 & 0 & 0 & 0 & 0 & 0 & 0 & 0 & 0 & 0 & 0 & 0 & 1 & \ldots & & \ldots & 0 & 0 \\ 0 & 0 & 0 & 0 & 0 & 0 & 0 & 1 & 1 & 0 & 0 & 0 & 0 & 0 & 0 & 0 & 0 & 0 & 0 & 0 & \ldots & \ldots & & 0 & 0 \\ 0 & 0 & 0 & 0 & 0 & 0 & 0 & 0 & 1 & 1 & 0 & 0 & 0 & 0 & 0 & 0 & 0 & 0 & 0 & 0 & \ldots & \ldots & & 0 & 0 \\ 0 & 0 & 0 & 0 & 0 & 0 & 0 & 0 & 0 & 1 & 1 & 0 & 0 & 0 & 0 & 0 & 0 & 0 & 0 & 0 & \ldots & \ldots & & 0 & 0 \\ 0 & 0 & 0 & 0 & 0 & 0 & 0 & 0 & 0 & 0 & 1 & 1 & 0 & 0 & 0 & 0 & 0 & 0 & 0 & 0 & \ldots & \ldots & & 0 & 0 \\ 0 & 0 & 0 & 0 & 0 & 0 & 0 & 0 & 0 & 0 & 0 & 1 & 1 & 0 & 0 & 0 & 0 & 0 & 0 & 0 & \ldots & \ldots & & 0 & 0 \\ 0 & 0 & 0 & 0 & 0 & 0 & 0 & 0 & 0 & 0 & 0 & 0 & 1 & 1 & 0 & 0 & 0 & 0 & 0 & 0 & \ldots & \ldots & & 0 & 0 \\ 1 & 0 & 0 & 0 & 0 & 0 & 0 & 0 & 0 & 0 & 0 & 0 & 0 & 1 & 1 & 0 & 0 & 0 & 0 & 0 & \ldots & \ldots & & 0 & 0 \\ 0 & 1 & 0 & 0 & 0 & 0 & 0 & 0 & 0 & 0 & 0 & 0 & 0 & 0 & 1 & 1 & 0 & 0 & 0 & 0 & \ldots & \ldots & & 0 & 0 \\ 1 & 0 & 1 & 0 & 0 & 0 & 0 & 0 & 0 & 0 & 0 & 0 & 0 & 0 & 0 & 1 & 1 & 0 & 0 & 0 & \ldots & \ldots & & 0 & 0 \\ 0 & 1 & 0 & 1 & 0 & 0 & 0 & 0 & 0 & 0 & 0 & 0 & 0 & 0 & 0 & 0 & 1 & 1 & 0 & 0 & \ldots & \ldots & & 0 & 0 \\ 0 & 0 & 1 & 0 & 1 & 0 & 0 & 0 & 0 & 0 & 0 & 0 & 0 & 0 & 0 & 0 & 0 & 1 & 1 & 0 & \ldots & \ldots & & 0 & 0 \\ 0 & 0 & 0 & 1 & 0 & 1 & 0 & 0 & 0 & 0 & 0 & 0 & 0 & 0 & 0 & 0 & 0 & 0 & 1 & 1 & \ldots & \ldots & & 0 & 0 \\ 1 & 1 & 1 & 1 & 0 & 1 & 1 & 1 & 1 & 1 & 1 & 1 & 1 & 1 & 1 & 1 & 1 & 0 & 0 & 0 & \ldots & & \ldots & 1 & 0 \\ 1 & 1 & 1 & 1 & 0 & 1 & 1 & 1 & 1 & 1 & 1 & 1 & 1 & 1 & 1 & 1 & 1 & 0 & 0 & 0 & \ldots & & \ldots & 0 & 1 \end{pmatrix}.$$

The two matrixes are substituted into the LFSR2 calculation formula $X(i)=F_i \otimes (X(0) \oplus L_{m*i} \otimes D)$, from which the following can be acquired:

$X'_{15}=d_{34}\oplus d_{33}\oplus d_{32}$
$\oplus d_{31}\oplus d_{30}\oplus d_{29}\oplus d_{28}\oplus d_{27}\oplus d_{26}\oplus d_{25}\oplus d_{24}\oplus d_{22}\oplus d_{20}$
$\oplus d_{20}\oplus d_{19}\oplus d_{18}\oplus d_{17}\oplus d_{16}\oplus d_{15}\oplus d_{14}\oplus X_{14}\oplus d_{13}\oplus X_{13}$
$\oplus d_{12}\oplus X_{12}$
$\oplus d_{11}\oplus X_{11}\oplus d_{10}\oplus X_{10}\oplus d_9\oplus X_9\oplus d_6\oplus X_6\oplus d_5\oplus X_5\oplus d_4$
$\oplus X_4\oplus d_3\oplus X_3 \oplus d_2\oplus X_2\oplus d_1\oplus X_1\oplus d_0\oplus X_0$;

$X'_{14}=d_{34}\oplus d_{23}\oplus d_{22}\oplus d_{21}\oplus d_{20}\oplus d_8\oplus X_8\oplus d_6\oplus X_6$;
$X'_{13}=d_{33}\oplus d_{22}\oplus d_{21}\oplus d_{20}\oplus d_{19}\oplus d_7\oplus X_7\oplus d_5\oplus X_5$;
$X'_{12}=d_{32}\oplus d_{21}\oplus d_{20}\oplus d_{19}\oplus d_{18}\oplus d_6\oplus X_6\oplus d_4\oplus X_4$;
$X'_{11}=d_{35}\oplus d_{31}\oplus d_{20}\oplus d_{19} \oplus d_{18}\oplus d_{17}\oplus d_5\oplus X_5\oplus d_3\oplus X_3$;
$X'_{11}=d_{35}\oplus d_{31}\oplus d_{20}\oplus d_{19}\oplus d_{18}\oplus d_{17}\oplus d_5\oplus X_5\oplus d_3\oplus X_3$;
$X'_{10}=d_{34}\oplus d_{30}\oplus d_{19}\oplus d_{18}\oplus d_{17}\oplus d_{16}\oplus d_4\oplus X_4\oplus d_2\oplus X_2$;
$X'_9=d_{33}\oplus d_{29}\oplus d_{18}\oplus d_{17}\oplus d_{16}\oplus d_{15}\oplus X_{15}\oplus d_3\oplus X_3\oplus d_1\oplus X_1$;
$X'_8=d_{32}\oplus d_{28}\oplus d_{17}\oplus d_{16}\oplus d_{15}\oplus X_{15}\oplus d_{14}\oplus X_{14}\oplus d_2\oplus X_2\oplus d_0\oplus X_0$;
$X'_7=d_{31}\oplus d_{27}\oplus d_{16}\oplus d_{15}\oplus X_{15}\oplus d_{14}\oplus X_{14}\oplus d_{13}\oplus X_{13}\oplus d_1\oplus X_1$;
$X'_6=d_{30}\oplus d_{26}\oplus d_{15}\oplus X_{15}\oplus d_{14}\oplus X_{14}\oplus d_{13}\oplus X_{13}\oplus d_{12}\oplus X_{12}\oplus d_0\oplus X_0$;
$X'_5=d_{29}\oplus d_{25}\oplus d_{14}\oplus X_{14}\oplus d_{13}\oplus X_{13}\oplus d_{12}\oplus X_{12}\oplus d_{11}\oplus X_{11}$;
$X'_4=d_{28}\oplus d_{24}\oplus d_{13}\oplus X_{13}\oplus d_{12}\oplus x_{12}\oplus d_{11}\oplus X_{11}\oplus d_{10}\oplus X_{10}$;
$X'_3=d_{27}\oplus d_{23}\oplus d_{12}\oplus X_{12}\oplus d_{11}\oplus X_{11}\oplus d_{10}\oplus X_{10}\oplus d_9\oplus X_9$;
$X'_2=d_{26}\oplus d_{22}\oplus d_{11}\oplus X_{11}\oplus d_{10}\oplus X_{10}\oplus d_9\oplus X_9\oplus d_8\oplus X_8$;
$X'_1=d_{35}\oplus d_{34}\oplus d_{33}\oplus d_{32}\oplus d_{31}\oplus d_{30}\oplus d_{29}\oplus d_{28}\oplus d_{27}\oplus d_{26}$
$\oplus d_{24}\oplus d_{22}\oplus d_{21}\oplus d_{20}$
$\oplus d_{19}\oplus d_{18}\oplus d_{17}\oplus d_{16}\oplus d_{15}\oplus X_{15}\oplus d_{14}\oplus X_{14}\oplus d_{13}\oplus X_{13}$
$\oplus d_{12}\oplus X_{12}\oplus d_{11}\oplus X_{11}$
$\oplus d_8\oplus X_8\oplus d_7\oplus X_7\oplus d_6\oplus X_6\oplus d_5\oplus X_5\oplus d_4\oplus X_4\oplus d_3\oplus X_3$
$\oplus d_2\oplus X_2\oplus d_1 \oplus X_1\oplus d_0\oplus X_0$; and
$X'_0=d_{35}\oplus d_{34}\oplus d_{33}\oplus d_{32}\oplus d_{31}\oplus d_{30}\oplus d_{29}\oplus d_{28}\oplus d_{27}\oplus d_{26}$
$\oplus d_{25}\oplus d_{23}\oplus d_{21}\oplus d_{20}$
$\oplus d_{19}\oplus d_{18}\oplus d_{17}\oplus d_{16}\oplus d_{15}\oplus X_{15}\oplus d_{14}\oplus X_{14}\oplus d_{13}\oplus X_{13}$
$\oplus d_{12}\oplus X_{12}\oplus d_{11}\oplus X_{11}$
$\oplus d_{10}\oplus X_{10}\oplus d_7\oplus X_7\oplus d_6\oplus X_6\oplus d_5\oplus X_5\oplus d_4\oplus X_4\oplus d_3\oplus X_3$
$\oplus d_2\oplus X_2\oplus d_1 \oplus X_1\oplus d_0\oplus X_0$.

Using the common term combination algorithm to optimize the above calculation formula, following expressions can be acquired:

$X'_{15}=(d_{20}\oplus d_{25})\oplus[d_{24}\oplus(d_{19}\oplus d_{18})]\oplus[(d_{17}\oplus d_{16})\oplus(d_{28}\oplus d_{32})]\oplus[(d_{27}\oplus d_{31}) \oplus(d_{29}\oplus d_{33})]\oplus[(d_{30}\oplus d_{34})\oplus$ $(d_{22} \oplus d_{26}) \oplus [(d_0 \oplus X_0) \oplus (d_9 \oplus X_9)] \oplus \{[(d_{11} \oplus X_{11}) \oplus (d_{12} \oplus X_{12})] \oplus [(d_{13} \oplus X_{13}) \oplus (d_{14} \oplus X_{14})]\} \oplus \{\{[(d_1 \oplus X_1) \oplus (d_{15} \oplus X_{15})] \oplus [(d_3 \oplus X_3) \oplus (d_5 \oplus X_5)]\} \oplus \{[(d_2 \oplus X_2) \oplus (d_4 \oplus X_4)] \oplus [(d_6 \oplus X_6) \oplus (d_{10} \oplus X_{10})]\}\};$ $X'_{14} = (d_{23} \oplus d_{34}) \oplus [d_{22} \oplus (d_{20} \oplus d_{21})] \oplus [(d_6 \oplus X_6) \oplus (d_8 \oplus X_8)];$ $X'_{13} = (d_{22} \oplus d_{33}) \oplus [d_{19} \oplus (d_{20} \oplus d_{21})] \oplus [(d_7 \oplus X_7) \oplus (d_5 \oplus X_5)];$ $X'_{12} = (d_{20} \oplus d_{21}) \oplus [d_{32} \oplus (d_{18} \oplus d_{19})] \oplus [(d_6 \oplus X_6) \oplus (d_4 \oplus X_4)];$ $X'_{11} = (d_{17} \oplus d_{20}) \oplus [(d_{18} \oplus d_{19}) \oplus (d_{31} \oplus d_{35})] \oplus [(d_3 \oplus X_3) \oplus (d_5 \oplus X_5)];$ $X'_{10} = (d_{16} \oplus d_{17}) \oplus [(d_{18} \oplus d_{19}) \oplus (d_{30} \oplus d_{34})] \oplus [(d_2 \oplus X_2) \oplus (d_4 \oplus X_4)];$ $X'_9 = (d_{29} \oplus d_{33}) \oplus [d_{18} \oplus (d_{16} \oplus d_{17})] \oplus \{[(d_3 \oplus X_3) \oplus (d_1 \oplus X_1)] \oplus (d_{15} \oplus X_{15})\};$ $X'_8 = [(d_{16} \oplus d_{17}) \oplus (d_{28} \oplus d_{32})] \oplus [(d_0 \oplus X_0) \oplus (d_2 \oplus X_2) \oplus [(d_{14} \oplus X_{14} \oplus (d_{15} \oplus X_{15})];$ $X'_7 \oplus [d_{16} \oplus (d_{27} \oplus d_{31})] \oplus \{[(d_1 \oplus X_1) \oplus (d_{15} \oplus X_{15})] \oplus [(d_{13} \oplus X_{13}) \oplus (d_{14} \oplus X_{14})]\};$ $X'_6 = (d_{26} \oplus d_{30}) \oplus [(d_{12} \oplus X_{12}) \oplus (d_{15} \oplus X_{15})] \oplus \{(d_0 \oplus X_0) \oplus [(d_{13} \oplus X_{13} \oplus (d_{14} \oplus X_{14})]\};$ $X'_5 = (d_{25} \oplus d_{29}) \oplus \{[(d_{11} \oplus X_{11}) \oplus (d_{12} \oplus X_{12})] \oplus [(d_{13} \oplus X_{13}) \oplus (d_{14} \oplus X_{14})]\};$ $X'_4 = (d_{24} \oplus d_{28}) \oplus \{[(d_{11} X_{11}) \oplus (d_{12} \oplus X_{12})] \oplus [(d_{10} \oplus X_{10}) \oplus (d_{13} \oplus X_{13})]\};$ $X'_3 = (d_{23} \oplus d_{27}) \oplus \{[(d_{11} \oplus X_{11}) \oplus (d_{12} \oplus X_{12})] \oplus [(d_{10} \oplus X_{10}) \oplus (d_9 \oplus X_9)]\};$ $X'_2 = (d_{22} \oplus d_{26}) \oplus \{[(d_{11} \oplus X_{11}) \oplus (d_8 \oplus X_8)] \oplus [(d_{10} \oplus X_{10}) \oplus (d_9 \oplus X_9)]\};$ $X'_1 = (d_{24} \oplus d_{35}) \oplus [(d_{28} \oplus d_{32}) \oplus (d_{22} \oplus d_{26})] \oplus \{[(d_{19} \oplus d_{18}) \oplus (d_{30} \oplus d_{34})] \oplus [9 d_{27} \oplus d_{31}) \oplus (d_{29} \oplus d_{33})]\} \oplus [(d_{17} \oplus d_{16}) \oplus (d_{20} \oplus d_{21})] \oplus [(d_6 \oplus X_6) \oplus (d_8 \oplus X_8)] \oplus \{[(d_{11} \oplus X_{11}) \oplus (d_{12} \oplus X_{12})] \oplus [(d_{13} \oplus X_{13}) \oplus (d_{14} \oplus X_{14})]\} \oplus \{\{[(d_1 \oplus X_1) \oplus (d_{15} \oplus X_{15})] \oplus [(d_3 \oplus X_3) \oplus (d_5 \oplus X_5)]\} \oplus \{[(d_2 \oplus X_2) \oplus (d_4 \oplus X_4)] \oplus [(d_0 \oplus X_0) \oplus (d_7 \oplus X_7)]\}\};$ and $X'_0 = [(d_{17} \oplus d_{16}) \oplus (d_{28} \oplus d_{32})] \oplus [(d_{25} \oplus d_{35}) \oplus (d_{23} \oplus d_{26})] \oplus \{[(d_{19} \oplus d_{18}) \oplus (d_{30} \oplus d_{34})] \oplus [(d_{27} \oplus d_{31}) \oplus (d_{29} \oplus d_{33})]\} \oplus (d_{20} \oplus d_{21}) \oplus [(d_0 \oplus X_0) \oplus (d_7 \oplus X_7)] \oplus \{[(d_{11} \oplus X_{11}) \oplus (d_{12} \oplus X_{12})] \oplus [(d_{13} \oplus X_{13}) \oplus (d_{14} \oplus X_{14})]\} \oplus \{\{[(d_1 \oplus X_1) \oplus (d_{15} \oplus X_{15})] \oplus [(d_3 \oplus X_3) \oplus (d_5 \oplus X_5)]\} \oplus \{[(d_2 \oplus X_2) \oplus (d_4 \oplus X_4)] \oplus [(d_6 \oplus X_6) \oplus (d_{10} \oplus X_{10})]\}\}.$ Substituting the data whose CRC code to be computed and the last calculated CRC into the calculated formula, the calculated CRC code of this time can be acquired.

It is judged whether the data to be checked is completely processed, if not, the data is circularly processed until the data is completely processed. After the data is completely processed, the value in the registers is the finally acquired CRC code value of the data needing to be checked. Then, the CRC code and the data needing to be checked are together sent to a receiver for being checked by the receiver.

By virtue of the present invention, the problem that the load of registers is increased when the number of digits of the data needing to be checked is not the nth power of 2 in the conventional art is solved, and the effect of reducing the load of the registers is achieved. The technical solution provided by the invention can select the number of digits of the CRC code in parallel computation every time according to the format of the data needing to be checked, and also can use the common term combination algorithm to acquire XOR logics as many as possible, so that the performance of the system for calculating the CRC code is obviously improved, and the calculation requirements of the CRC data processing are met to the maximum extent. In addition, in a hardware circuit design, by using the common term combination algorithm, the amount of components can be reduced, so the area and cost can also be reduced.

Obviously, those skilled in the art shall understand that the above-mentioned modules and steps of the present invention can be realized by using general purpose calculating device, can be integrated in one calculating device or distributed on a network which consists of a plurality of calculating devices. Alternatively, the modules and the steps of the present invention can be realized by using the executable program code of the calculating device. Consequently, they can be stored in the storing device and executed by the calculating device, or they are made into integrated circuit module respectively, or a plurality of modules or steps thereof are made into one integrated circuit module. In this way, the present invention is not restricted to any particular hardware and software combination.

The descriptions above are only the preferable embodiment of the present invention, which are not used to restrict the present invention. For those skilled in the art, the present invention may have various changes and variations. Any amendments, equivalent substitutions, improvements, etc within the spirit and principle of the present invention are all included in the scope of the protection of the present invention.

What is claimed is:

1. A method for data check processing, comprising:
acquiring data to be checked;
acquiring a first polynomial matrix F according to a generator polynomial;
acquiring a second generator polynomial matrix $F_i$ according to $F_i = f^i$, wherein i is the number of digits of the data, and $F_i = F^i$ indicates that $F_i$ is the i-th power of F;
generating a cyclic redundancy check (CRC) code of the data from the second generator polynomial matrix $F_i$, initial CRC register value X(0) and the data; and
sending the data and the CRC code to a receiver for being checked by the receiver.

2. The method according to claim 1, wherein generating a CRC code of the data from the second generator polynomial matrix $F_i$, the initial CRC register value X(0) and the data comprises:
under the condition that the order of the generator polynomial is m with m being greater than or equal to i and the line feedback shift register (LFSR) used for calculation is LFSR1,
generating the CRC code $X(i) = F_i \otimes X(0) \oplus D$ of the data, wherein $D = [0, 0, \ldots, 0, d_0, d_1, \ldots, d_{i-2}, d_{i-1}]^T$, $[d_0, d_1, \ldots, d_{i-2}, d_{i-1}]^T$ is the data, the row number of D is m, $\oplus$ represents the XOR calculation of the elements at the same location of two matrixes, and $\otimes$ represents bit AND calculation.

3. The method according to claim 1, wherein generating a CRC code of the data from the second generator polynomial matrix $F_i$, the initial CRC register value X(0) and the data comprises:
under the condition that the order of the generator polynomial is m with m being greater than or equal to i and the LFSR used for calculation is LFSR2,
generating the CRC code $X(i) = F_i \otimes (X(0) \oplus D)$ of the data, wherein, $D = [d_0, d_1, \ldots, d_{i-2}, d_{i-1}, 0, 0, \ldots, 0]^T$, $[d_0, d_1, \ldots, d_{i-2}, d_{i-1}]^T$ is the data and the row number of D is m.

4. The method according to claim 1, wherein generating a CRC code of the data from the second generator polynomial matrix $F_i$, the initial CRC register value X(0) and the data comprises:

under the condition that the order of the generator polynomial is m with m being less than i and the LFSR used for calculation is LFSR1, generating the CRC code $X(i)=F_i \otimes X(0) \oplus L_{m*i} \otimes D$ of the data, wherein, D is the data $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \leq k \leq m-i-1$, $P=[P_{m-1}, P_{m-2}, \ldots, P_1, P_0]$ is the generator polynomial, and $I_m$ is a unit matrix.

5. The method according to claim 1, wherein generating a CRC code of the data from the second generator polynomial matrix $F_i$, the initial CRC register value X(0) and the data comprises:

under the condition that the order of the generator polynomial is m with m being less than i and the LFSR used for calculation is LFSR2, generating the CRC code $X(i)=F_i \otimes (X(0) \oplus L_{m*i} \otimes D)$ of the data, wherein, D is the data $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \leq k \leq m-i-1$, $P=[P_{m-1}, P_{m-2}, \ldots, P_1, P_0]$ is the generator polynomial, and $I_m$, is a unit matrix.

6. The method according to claim 2, wherein, before sending the data and the CRC code to a receiver, the method further comprises:

selecting from the matrix X(i) one of the columns which each comprise the most term "1", as a first column to be processed;

selecting from the matrix X(i) one column which comprises the most "1" with the term "1" being at the same row with any term "1" of the first column to be processed, as the second column to be processed;

changing the terms in the row having "1" at all in the first and second columns to be processed to be "0"; and repeating the above steps until each row only has one term "1" at the most in the matrix X(i).

7. The method according to claim 6, wherein, after changing the terms in the row having "1" at all in the first and second columns to be processed to be "0", the method further comprises:

deleting the columns without "1" in the first and second columns to be processed.

8. An apparatus for data check processing, comprising:

an acquiring module, configured to acquire data to be checked;

a first acquiring module, configured to acquire a first polynomial matrix F according to a generator polynomial;

a second acquiring module, configured to acquire a second generator polynomial matrix $F_i$ according to $F_i=F^i$, wherein i is the number of digits of the data, and $F_i=F^i$ indicates that $F_i$ is the i-th power of F;

a generating module, configured to generate a cyclic redundancy check (CRC) code of the data from the second generator polynomial matrix $F_i$, initial CRC register value X(0) and the data; and a sending module, configured to send the data and the CRC code to a receiver for being checked by the receiver.

9. The apparatus according to claim 8, wherein the generating module comprises:

a first generating sub-module, configured to generate the CRC code $X(i)=F_i \otimes (X(0) \oplus L_{m*i} \otimes D$ of the data, under the condition that the generator polynomial is m with m being less than i, and the LFSR used for calculation is LFSR1, wherein D is the data $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \leq k \leq m-i-1$, $P=[P_{m-1}, P_{m-2}, \ldots, P_1, P_0]$ is the generator polynomial, and $I_m$ is a unit matrix, $\oplus$ represents the XOR calculation of the elements at the same location of two matrixes, and $\otimes$ represents bit AND calculation.

10. The apparatus according to claim 8, wherein the generating module comprises:

a second generating sub-module, configured to generate the CRC code $X(i)=F_i \otimes (X(0) \oplus L_{m*i} \otimes D)$ of the data, under the condition that the order of the generator polynomial is m with m being less than i, and the LFSR used for calculation is LFSR2, wherein D is the data $[d_0, d_1, \ldots, d_{i-2}, d_{i-1}]^T$, $L_{m*i}=[F_{m-i-1} \otimes P, F_{m-i-2} \otimes P, \ldots, P|I_m]_{m*i}$, $F_k$ is the k-th power of F, $0 \leq k \leq m-i-1$, $P=[P_{m-1}, P_{m-2}, \ldots, P_1, P_0]$ is the generator polynomial, and $I_m$ is a unit matrix.

11. The method according to claim 3, wherein, before sending the data and the CRC code to a receiver, the method further comprises:

selecting from the matrix X(i) one of the columns which each comprise the most term "1", as a first column to be processed;

selecting from the matrix X(i) one column which comprises the most "1" with the term "1" being at the same row with any term "1" of the first column to be processed, as the second column to be processed;

changing the terms in the row having "1" at all in the first and second columns to be processed to be "0"; and repeating the above steps until each row only has one term "1" at the most in the matrix X(i).

12. The method according to claim 4, wherein, before sending the data and the CRC code to a receiver, the method further comprises:

selecting from the matrix X(i) one of the columns which each comprise the most term "1", as a first column to be processed;

selecting from the matrix X(i) one column which comprises the most "1" with the term "1" being at the same row with any term "1" of the first column to be processed, as the second column to be processed;

changing the terms in the row having "1" at all in the first and second columns to be processed to be "0"; and repeating the above steps until each row only has one term "1" at the most in the matrix X(i).

13. The method according to claim 5, wherein, before sending the data and the CRC code to a receiver, the method further comprises:

selecting from the matrix X(i) one of the columns which each comprise the most term "1", as a first column to be processed;

selecting from the matrix X(i) one column which comprises the most "1" with the term "1" being at the same row with any term "1" of the first column to be processed, as the second column to be processed;

changing the terms in the row having "1" at all in the first and second columns to be processed to be "0"; and repeating the above steps until each row only has one term "1" at the most in the matrix X(i).

* * * * *